US008690135B2

(12) United States Patent
Vekstein et al.

(10) Patent No.: US 8,690,135 B2
(45) Date of Patent: Apr. 8, 2014

(54) CHUCK AND A METHOD FOR SUPPORTING AN OBJECT

(75) Inventors: Uri Vekstein, Haifa (IL); Valery Nuzni, Ma'alot (IL); Ehud Efrat, Zichron Yaakov (IL)

(73) Assignee: Camtek Ltd., Nigdal Haemek, IL (US)

( * ) Notice: Subject to any disclaimer, the term of this patent is extended or adjusted under 35 U.S.C. 154(b) by 936 days.

(21) Appl. No.: 12/519,763

(22) PCT Filed: Dec. 13, 2007

(86) PCT No.: PCT/IL2007/001550
§ 371 (c)(1),
(2), (4) Date: Mar. 29, 2010

(87) PCT Pub. No.: WO2008/075340
PCT Pub. Date: Jun. 26, 2008

(65) Prior Publication Data
US 2010/0194015 A1 Aug. 5, 2010

Related U.S. Application Data

(60) Provisional application No. 60/870,583, filed on Dec. 18, 2006.

(51) Int. Cl.
*B25B 1/00* (2006.01)

(52) U.S. Cl.
USPC ............................................. 269/21; 269/289 R (58) Field of Classification Search
USPC ............... 269/289 R, 21, 20, 900, 903
See application file for complete search history.

(56) References Cited

U.S. PATENT DOCUMENTS

| 6,019,164 | A  | * | 2/2000  | Getchel et al. ............... 165/80.1 |
| 6,073,681 | A  | * | 6/2000  | Getchel et al. ............... 165/80.1 |
| 6,375,176 | B1 | * | 4/2002  | Getchel et al. ................. 269/21 |
| 6,540,014 | B2 | * | 4/2003  | Getchel et al. ............... 165/80.1 |
| 6,740,853 | B1 |   | 5/2004  | Johnson et al. |
| 7,311,302 | B1 | * | 12/2007 | Farlow et al. ................. 269/296 |
| 7,331,097 | B2 | * | 2/2008  | Stone et al. .................... 29/458 |
| 7,425,238 | B2 | * | 9/2008  | Muto et al. .................... 118/728 |

(Continued)

FOREIGN PATENT DOCUMENTS

JP        2002 324831        11/2002

OTHER PUBLICATIONS

International Search Report for International Application No. PCT/IL2007/001550 mailed Apr. 18, 2008.

*Primary Examiner* — Lee D Wilson
(74) *Attorney, Agent, or Firm* — Oren Reches (57) ABSTRACT

There is provided a chuck that includes a supporting element that is connected to a closing element. An upper surface of the supporting element includes a chemically etched zone and an un-etched zone. The chemically etched zone includes multiple upper areas that are surrounded by trenches. At least one pressurized gas conduit is formed in the supporting element so as to enable pressurized gas provided to a lower surface of the supporting element to propagate through the trenches. The un-etched zone is shaped in response to a shape of an object to be placed on the supporting element. The un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck.

54 Claims, 7 Drawing Sheets

(56) References Cited

U.S. PATENT DOCUMENTS

| | | |
|---|---|---|
| 2003/0001103 A1 | 1/2003 | Kobayashi et al. |
| 2004/0173581 A1 | 9/2004 | Udo et al. |
| 2004/0218339 A1 | 11/2004 | Nakamura |
| 2005/0207088 A1 | 9/2005 | Nishimoto et al. |
| 2006/0090855 A1 | 5/2006 | Kimura |
| 2007/0222131 A1* | 9/2007 | Fukumoto et al. ............ 269/21 |
| 2010/0194015 A1* | 8/2010 | Vekstein et al. .......... 269/289 R |

* cited by examiner

Placing an object in alignment with an un-etched zone of a chuck. The chuck includes a supporting element that is connected to a closing element. An upper surface of the supporting element includes a chemically etched zone and an un-etched zone. The chemically etched zone includes multiple upper areas that are surrounded by trenchs. At least one pressurized gas conduit is formed in the supporting element so as to enable pressurized gas provided to a lower surface of the supporting element to propagate through the trenchs. The un-etched zone is shaped in response to a shape of the object. 510

Sending sensing signals through multiple sensing aiding holes that are formed in the supporting element in order to determine which object is placed on the supporting element. 520

Supplying pressurized gas to the lower surface of the supporting element while reducing pressurized gas leakage by the un-etched zone and by the closing element. 530

> Forming at least one pressurized gas conduit in the supporting element so as to enable pressurized gas provided to a lower surface of the supporting element to propagate through the trenchs of the chemically etched zone. 614

> Polishing an upper surface of a supporting element of a chuck to provide a very flat surface. 616

> Chemically etching a chemically etched zone of the upper surface so as to generate multiple upper areas that are surrounded by trenchs. The un-etched zone is shaped in response to a shape of an object to be placed on the supporting element. The un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck. 618

Manufacturing a supporting element of the chuck. 610

Manufacturing a closing element of the chuck. 620

CHUCK AND A METHOD FOR SUPPORTING AN OBJECT

CROSS-REFERENCE TO RELATED APPLICATIONS

This application is a National Phase Application of PCT International Application No. PCT/IL2007/001550, entitled "A CHUCK AND A METHOD FOR SUPPORTING AN OBJECT", International Filing Date Dec. 13, 2007, published on Jun. 26, 2008 as International Publication No. WO 2008/075340, which in turn claims priority from U.S. Provisional Patent Application No. 60/870,583, filed Dec. 18, 2006, both of which are incorporated herein by reference in their entirety.

FIELD OF THE INVENTION

The invention relates to a chuck and to a method for supporting an object.

BACKGROUND OF THE INVENTION

Many types of objects need to be supported by chucks. These objects include, for example, diced wafers, non-diced wafers, masks, and the like.

A typical prior art chuck is manufactured by a highly complex manufacturing process and includes many components. It usually has a very flat upper surface that supports an object.

Diced wafers are supported by a very thin tape. These tapes tend to stick to the flat upper surface of the chuck. This problem does not occur in non-diced wafers.

Electrostatic chucks are fitted to support conductive objects and are not suited to support objects made of non-conductive materials.

It is expected that the materials out of which wafers and other objects are made will rapidly change. It is further expected to re-use the same components for inspecting or measuring different objects.

There is a need to provide efficient chucks and efficient methods for supporting an object.

SUMMARY OF THE INVENTION

A chuck that includes a supporting element that is connected to a closing element. An upper surface of the supporting element includes a chemically etched zone and an un-etched zone. The chemically etched zone includes multiple upper areas that are surrounded by trenches. At least one pressurized gas conduit is formed in the supporting element so as to enable pressurized gas provided to a lower surface of the supporting element to propagate through the trenches. The un-etched zone is shaped in response to a shape of an object to be placed on the supporting element. The un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck.

A method for manufacturing a chuck, the method includes: manufacturing a supporting element of the chuck and manufacturing a closing element of the chuck; wherein the stage of manufacturing the supporting element includes: forming at least one pressurized gas conduit in the supporting element so as to enable pressurized gas provided to a lower surface of the supporting element to propagate through the trenches of the chemically etched zone; polishing an upper surface of a supporting element of a chuck to provide a very flat surface; chemically etching a chemically etched zone of the upper surface so as to generate multiple upper areas that are surrounded by trenches. The un-etched zone is shaped in response to a shape of an object to be placed on the supporting element. The un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck.

A method for supporting an object, the method includes: (ii) placing an object in alignment with an un-etched zone of a chuck. The chuck includes a supporting element that is connected to a closing element. An upper surface of the supporting element includes a chemically etched zone and an un-etched zone. The chemically etched zone includes multiple upper areas that are surrounded by trenches. At least one pressurized gas conduit is formed in the supporting element so as to enable pressurized gas provided to a lower surface of the supporting element to propagate through the trenches. The un-etched zone is shaped in response to a shape of the object. (ii) Supplying pressurized gas to the lower surface of the supporting element while reducing pressurized gas leakage by the un-etched zone and by the closing element.

BRIEF DESCRIPTION OF THE DRAWINGS

The present invention will be understood and appreciated more fully from the following detailed description taken in conjunction with the drawings in which.

DETAILED DESCRIPTION OF THE DRAWINGS

A multi-purpose chuck is provided. It can effectively support multiple types of objects including conducting objects and non-conducting objects, semiconductor wafers, diced wafers and associated tape, printed circuit boards, lithographic masks, Micro Electro Mechanical Systems (MEMS), wafers that include glass, and the like.

The chuck includes two main parts—a supporting element (also referred to as main body) and a closing element (also referred to as bottom cover). The low number of parts contributes to the reliability of the chuck.

The chuck can be characterized by an improved manufacturability as the main parts of the chuck are made of commonly used materials and can be manufactured using conventional manufacturing processes such as milling, chemical etching, turning and lapping. The usage of these processes reduces the manufacturing cost of the chuck. Conveniently, the supporting element is made of a single material.

Conveniently, the supporting element and the closing element are made from a conducting material such as stainless steel. According to an embodiment of the invention the supporting element and the closing element are made of a material that complies with high cleanliness levels.

It is noted that the various drawings are out of scale. In addition some drawings do not include all the features of the diced wafer adaptor, for simplicity of explanation.

Figure 1:
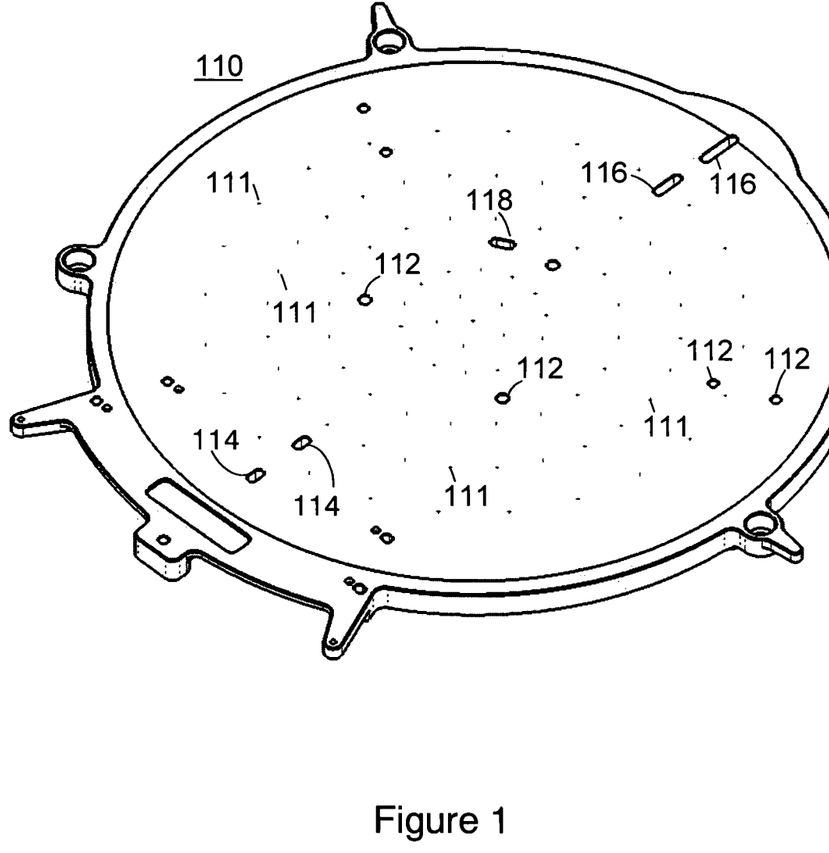
FIG. 1 is a three dimensional view of an upper surface of a supporting element of a chuck according to an embodiment of the invention.
Figure 2:
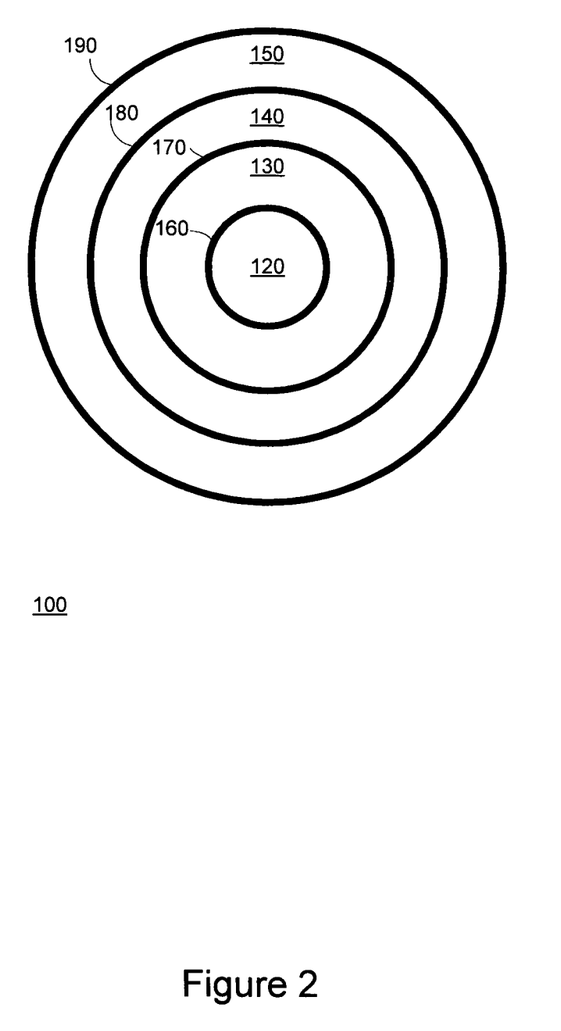
FIG. 2 illustrates multiple chemically etched zones and multiple un-etched zones according to an embodiment of the invention.

FIG. 1 is a three dimensional view of upper surface 110 of supporting element 100 of chuck 10 according to an embodiment of the invention. FIG. 2 illustrates multiple chemically etched zones 120, 130, 140 and 150 and multiple un-etched zones 160, 170, 180 and 190 according to an embodiment of the invention.

Figure 3:
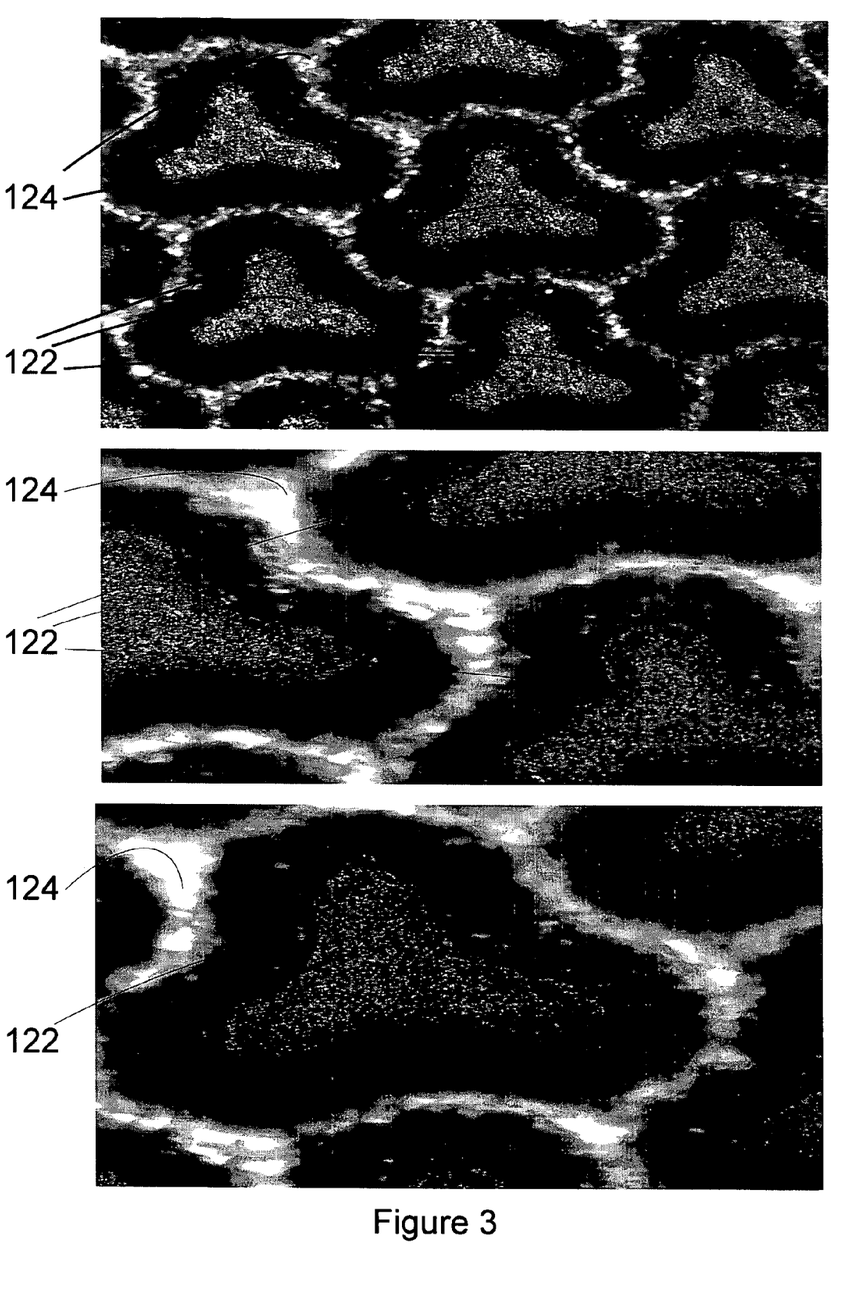
FIG. 3 illustrates multiple upper areas surrounded by trenches, according to an embodiment of the invention.

FIG. 3 illustrates multiple upper areas 122 surrounded by trenches 124, according to an embodiment of the invention.

Figure 4:
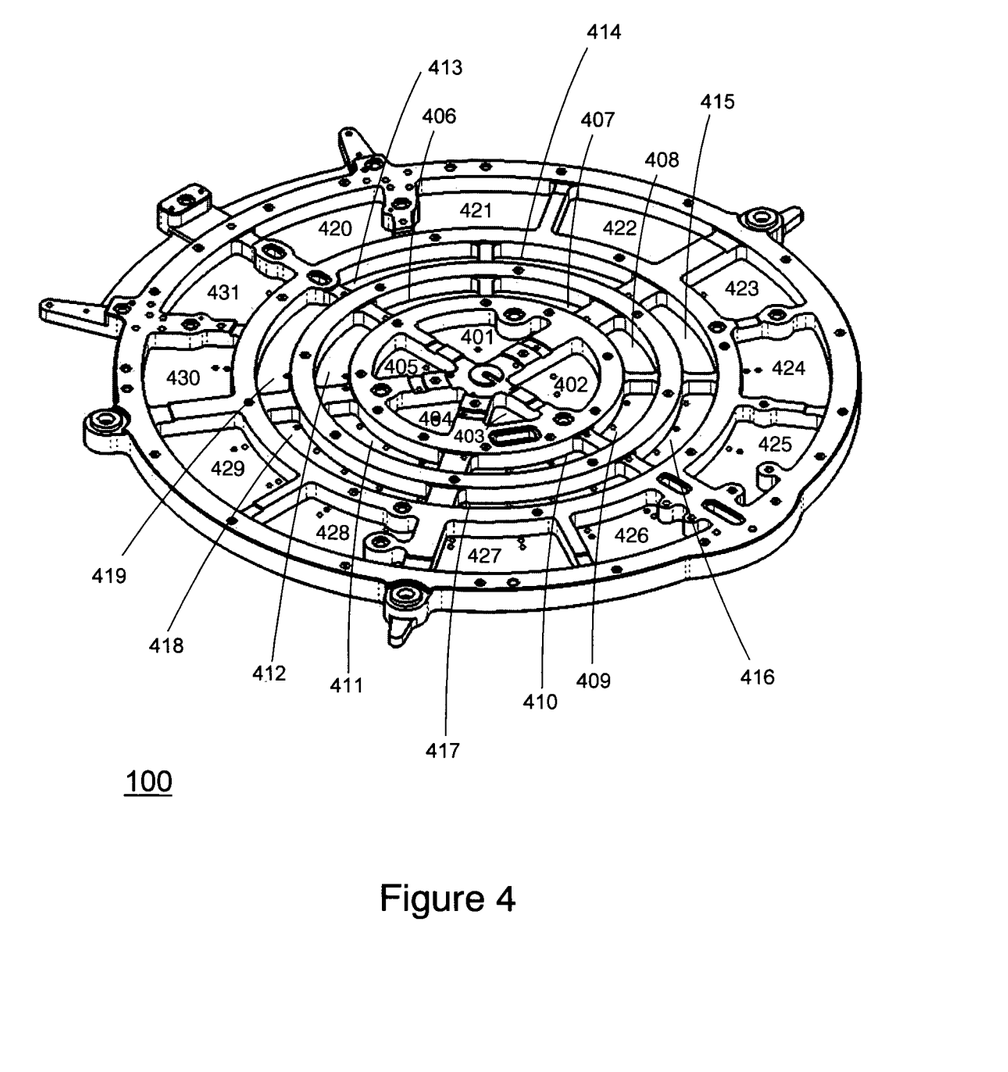
FIG. 4 illustrates a lower surface of the chuck according to an embodiment of the invention.
Figure 5:
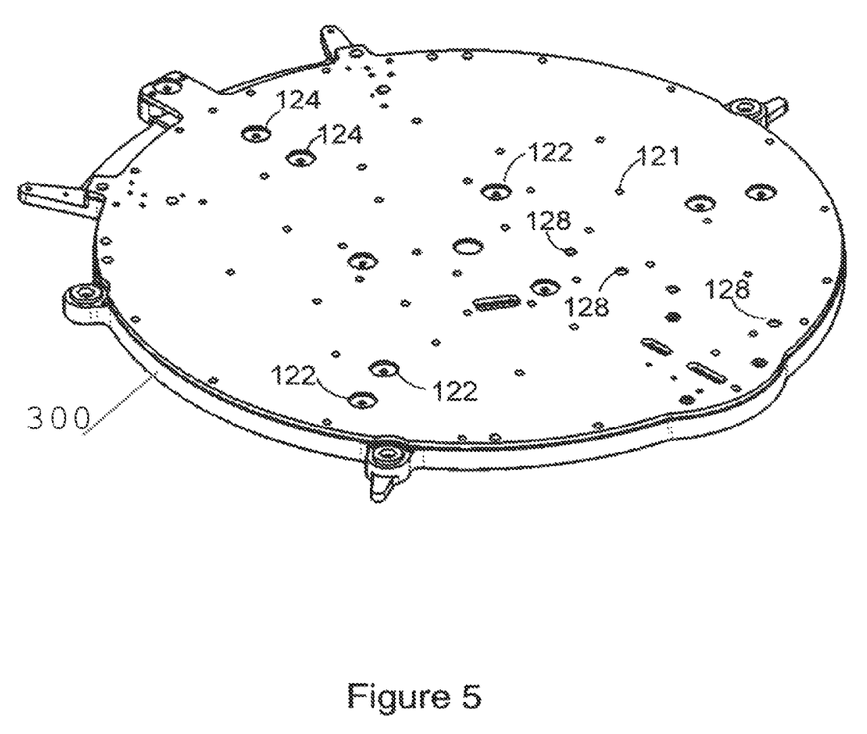
FIG. 5 illustrates closing element according to an embodiment of the invention.

FIG. 4 illustrates lower surface 200 of supporting element 100 according to an embodiment of the invention. FIG. 5 illustrates closing element 300 according to an embodiment of the invention. It is noted that the depth of a trench can exceed its width but this is not necessarily so.

Chuck 10 includes supporting element 100 and closing element 300. Supporting element 100 includes upper surface 110 and lower surface 200.

Upper surface 110 can include at least one chemically etched zone and at least one un-etched zone. For simplicity of explanation it is assumed that upper surface 110 includes four chemically etched zones 120, 130, 140 and 150) and four un-etched zones 160, 170, 180 and 190. It is also assumed that these zones are con-centric and shaped to support circular object of four different sizes. Each un-etched zone is shaped and sized so as to contact the edge of an object (of a corresponding size) that is placed on chuck 10 in alignment with that un-etched zone. An un-etched zone extends beyond the edge of the object in order to reduce leakage of pressurized gas that is supplied to the chuck and propagates through trenches of the chemically etched zones.

Each chemically etched zone out of chemically etched zones 120, 130, 140 and 150 includes multiple upper areas that are surrounded by trenches. These upper areas are not etched while the trenches (or trenches) that surround these upper areas are formed by chemical etching. The upper areas are conveniently microscopic. FIG. 3 include highly magnified images of sample clover shaped upper areas 122 that are surrounded by trenches 124. It is noted that other shapes can be formed by the chemical etching process. FIG. 3 illustrates upper areas that were surrounded by 25 micron deep trenches. The distance between the centers of adjacent upper areas was about 250 microns.

Conveniently, the distance between centers of two adjacent upper areas ranges between 200 micron and 300 micron. The depth of the trenches ranges between 20 micron and 60 micron. Conveniently, the depth of the trenches ranges between 25 micron and 30 micron.

Multiple pressurized gas conduits (such as holes 111) are formed in supporting element 100 so as to enable pressurized gas provided to lower surface 200 of the supporting element to propagate through the trenches. In other words, the pressurized gas conduit conveniently ends at a trench. The pressurized gas can be characterized by low pressure levels or by high pressure levels. It can include vacuumed gas or high pressure gas that can assist in lifting the object.

Conveniently, an aggregate area of upper areas within each chemically etched zone is substantially smaller than an overall area of the chemically etched zone.

Conveniently, the upper areas and an upper surface of one or more un-etched zone contacts the object when the object is placed on the chuck in alignment with the un-etched zone.

Multiple cavities 401-431 are formed in a lower portion of supporting element 100. These cavities are illustrated in FIG. 4. When these cavities are closed by closing element 300 multiple pressurized gas chambers are formed. Pressurized gas is provided to each chamber (via an inlet) and exits through holes in order to propagate though trenches positioned above the chamber.

Conveniently, each chamber receives pressurized gas through its own inlet. According to an embodiment of the invention, and as illustrated in FIG. 4, multiple cavities are formed in below each chemically etched zone. For example, cavities 401-405 are formed below chemically etched zone 120, cavities 406-412 are formed below chemically etched zone 130, cavities 413-419 are formed below chemically etched zone 140 and cavities 420-431 are formed below chemically etched zone 150.

Closing element 300 fits the lower portion of supporting element 100 so that when both parts are connected to each other pressurized gas that is provided to supporting element 100 barely leaks.

Conveniently, each un-etched zone reduces pressurized gas leakage from the un-etched zone and closing element 300 reduces pressurized gas leakage from a lower surface of the supporting element when the object is placed on the chuck in alignment with the un-etched zone and pressurized gas is provided to the chuck.

Chuck 10 is connected to pressurized gas delivery unit (not shown) via holes such as holes 128 that can independently provide pressurized gas to each chemically etched zone. The pressurized gas is provided to holes (inlets) (such as holes 128 of FIG. 5) formed in closing element 300, passes through pressurized chambers and through holes 111 formed within supporting element 100. Each chemically etched zone receives pressurized gas from one or more holes such as holes 111. By selecting which holes (and accordingly which chambers) will receive the gas, gas delivery unit can select which chemically etched zone receives the pressurize gas. Typically, pressurized gas is provided to chemically etched zones that support the object.

According to various embodiments of the invention multiple holes apertures or conduits are formed within closing element 300 and multiple corresponding holes are formed within supporting element 100. Some of these holes assist in connecting the closing element to the supporting element (for example by screws).

Supporting element 100 can include various holes, apertures of conduits. For example it can include sensing aiding holes 118 (of FIG. 1), pin conduits (such as pin conduit 112 of FIG. 1), object holding element conduits (such as object holding element conduits 116 of FIG. 1 and object holding element conduits 114) as well as holes 111 through which pressurized gas is provided to the upper surface 110 of supporting element 110.

A sensing signal is sent through each sensing aiding hole in order to determine which object is placed on the supporting element. Especially, such signals are sent to determine which chemically etched zones are supporting the object. Object supporting pins can travel (elevated or lowered) through pin conduits 112. Object supporting pins are adapted to support the object during an object placement process and an object removal process. The object can be held (and especially its perimeter can be held) by pins that extend through object holding element conduits 114 as well as by movable elements that can be forced (for example by a spring) to contact another (conveniently an opposite) portion of the object. Conveniently, lateral movements of the object are prevented by holding the object between a pin that elevates through an object holding element conduit 114 and between an element that can move within object holding element conduits 116.

Sealing element 300 can include various holes, apertures or conduits. For example it can include pin conduits and spring apertures (such as pin conduit and spring aperture 122 of FIG. 5), object holding element conduits (such as object holding element conduits 126 of FIG. 5 and object holding element conduits 124 of FIG. 5) as well as holes 128 through which pressurized gas is provided to chuck 10. Object supporting pins and a spring that pushes these springs upwards can be located within pin conduit and spring apertures 122. Object supporting pins are adapted to support the object during an object placement process and an object removal process. The object can be held (and especially its perimeter can be held) by pins that extend through object holding element conduits 124 as well as by movable elements that can be forced (for example by a spring) to contact another (conveniently an opposite) portion of the object. Conveniently, lateral movements of the object are prevented by holding the object between a pin that elevates through an object holding element conduit 124 and between an element that can move within object holding element conduits 126. Holes 121 assist in connecting the closing element to the supporting element (for example by screws).

Figure 6:
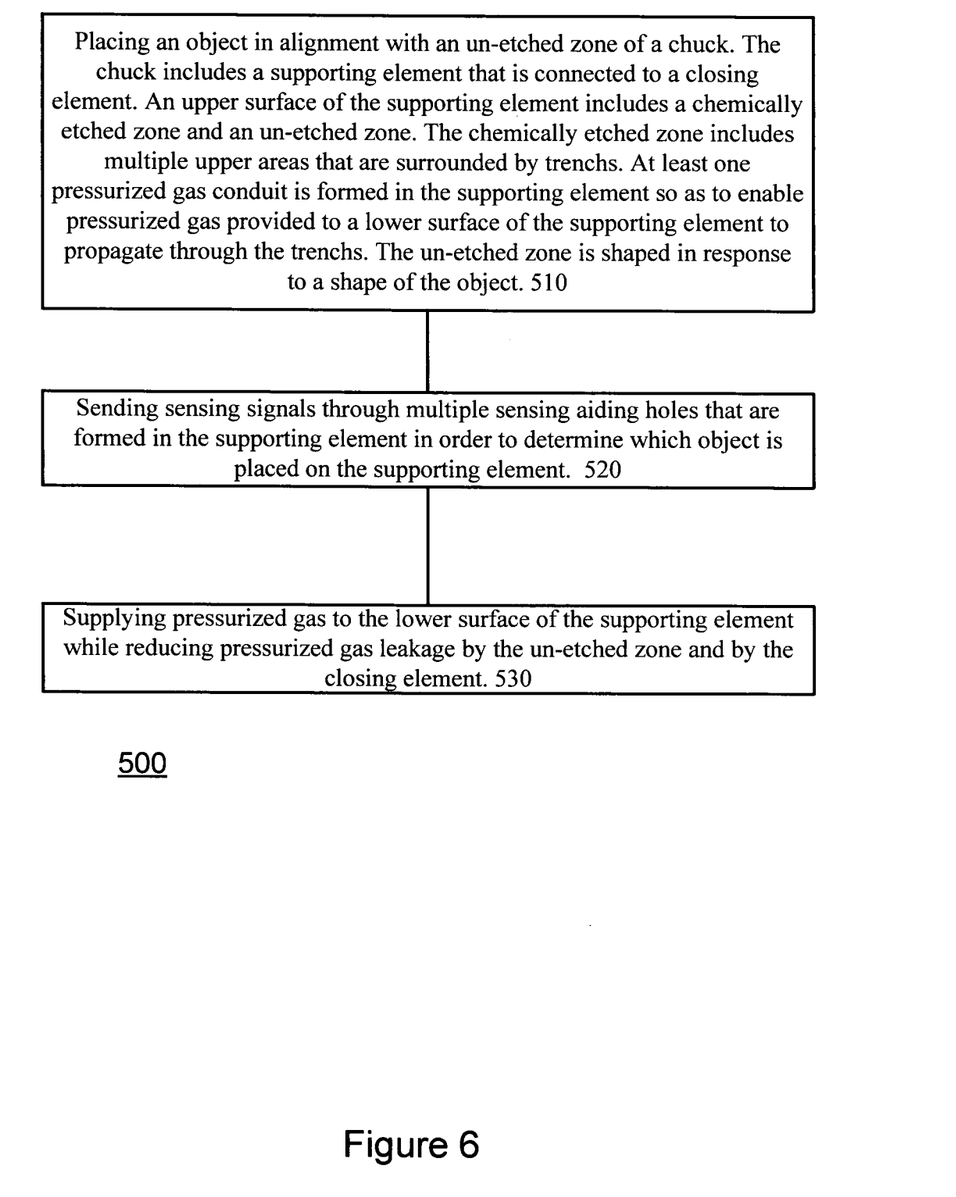
FIG. 6 is a flow chart of a method for supporting an object according to an embodiment of the invention.

FIG. 6 illustrates method 500 for supporting an object, according to an embodiment of the invention.

Method 500 starts by stage 510 of placing an object in alignment with an un-etched zone of a chuck. The chuck includes a supporting element that is connected to a closing element. An upper surface of the supporting element includes a chemically etched zone and an un-etched zone. The chemically etched zone includes multiple upper areas that are surrounded by trenches. At least one pressurized gas conduit is formed in the supporting element so as to enable pressurized gas provided to a lower surface of the supporting element to propagate through the trenches. The un-etched zone is shaped in response to a shape of the object.

Stage 510 can include at least one of the following stages or a combination thereof: (i) placing the object on the multiple upper areas of the chemically etched zone; wherein an aggregate area of upper areas within the chemically etched zone is substantially smaller than an overall area of the chemically etched zone; (ii) placing the object so as to contact the upper areas and an upper surface of the un-etched zone; (iii) placing the object on a supporting element that is made of a single material; (iv) placing the object on a supporting element that is made of a conductive material; (v) placing the object on a supporting element that includes multiple un-etched zones; wherein each un-etched zone surrounds at least one chemically etched zone; (vi) placing the object in alignment with an un-etched zone out of multiple concentric un-etched zones of the chuck; (vii) placing the object in alignment with an un-etched zone out of multiple quadratic shaped un-etched zones of the chuck; (viii) placing the object in alignment with an un-etched zone out of multiple un-etched zones of the chuck that are shaped in response to shapes of objects to be supported by the chuck; (ix) placing an object on multiple upper areas; wherein a distance between centers of two adjacent upper areas ranges between 200 micron and 300 micron and wherein a depth of the trenches ranges between 20 micron and 60 micron; (x) placing an object on multiple upper areas wherein a distance between centers of two adjacent upper areas ranges between 200 micron and 300 micron and wherein a depth of the trenches ranges between 25 micron and 30 micron; (xi)

Stage 510 is followed by optional stage 520 of sending sensing signals through multiple sensing aiding holes that are formed in the supporting element in order to determine which object is placed on the supporting element. It is noted that the size of the object can be determined in other manners. For example, it can be provided by an operator.

Stage 520 can be followed by stage 530 of supplying pressurized gas to the lower surface of the supporting element while reducing pressurized gas leakage by the un-etched zone and by the closing element.

Stage 530 can include at least one of the following stages or a combination thereof: (i) determining to which chemically etched zone to supply pressurized gas; and supplying the pressurized gas in response to the determination; wherein the pressurized gas propagated through multiple pressurized gas conduits that are formed in the supporting element so as to reach trenches of each chemically etched zone; (ii) supplying pressurized gas to multiple cavities that are formed in a lower portion of the supporting element; wherein the cavities are closed by the closing element so as to form multiple pressurized gas chambers; (iii) supplying pressurized gas to multiple cavities that are formed in correspondence to the chemically etched zones; and (iv) supplying pressurized gas to multiple cavities that are formed below each chemically etched zone.

Figure 7:
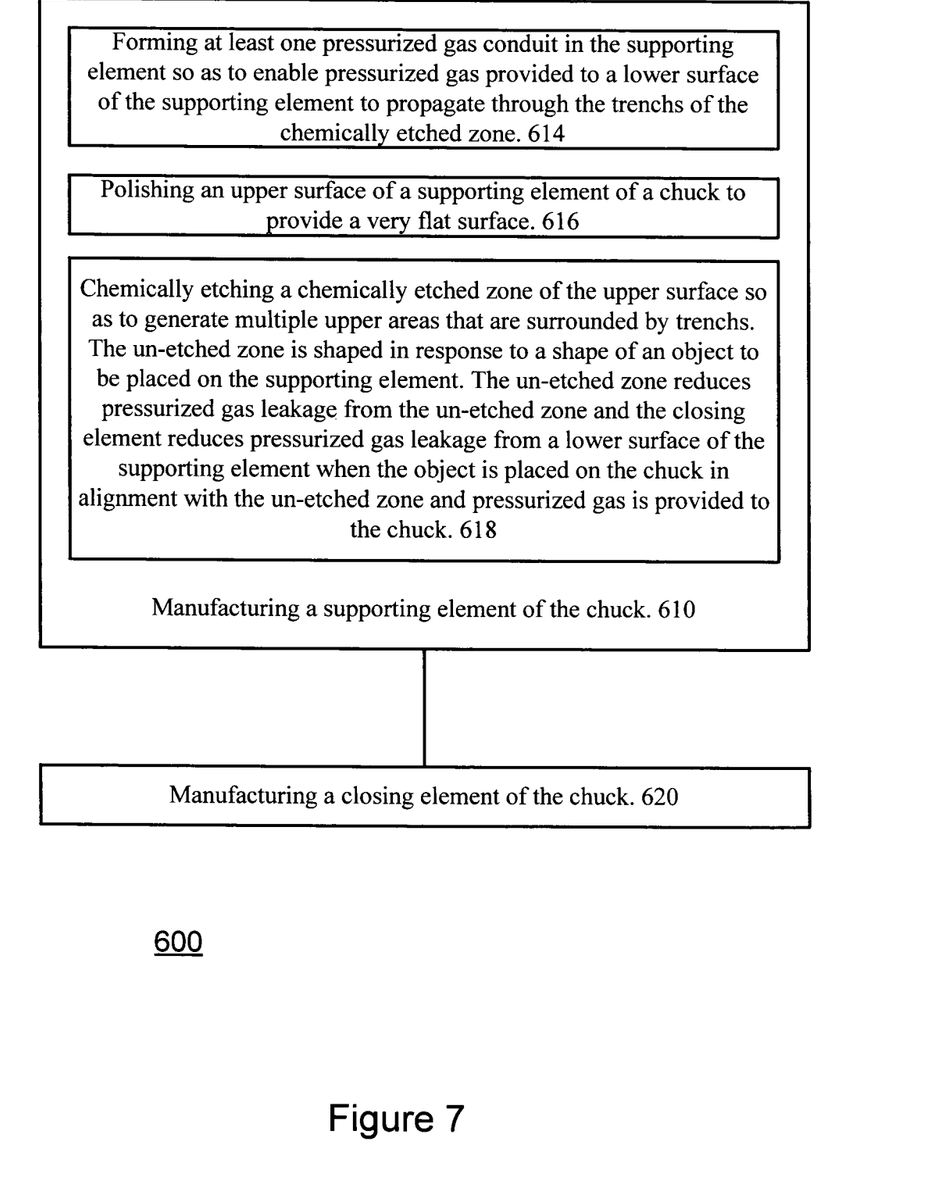
FIG. 7 is a flow chart of a method for manufacturing a chuck according to an embodiment of the invention.

FIG. 7 illustrates method 600 for manufacturing a chuck, according to an embodiment of the invention.

Method 600 starts by stages 610 and 620.

Stage 610 includes manufacturing a supporting element of the chuck.

Stage 620 includes manufacturing a closing element of the chuck. These stages can provide chuck 10.

Stage 610 includes: (i) stage 614 of forming at least one pressurized gas conduit in the supporting element so as to enable pressurized gas provided to a lower surface of the supporting element to propagate through the trenches of the chemically etched zone; (ii) stage 616 of polishing an upper surface of a supporting element of a chuck to provide a very flat surface; and (iii) stage 618 of chemically etching a chemically etched zone of the upper surface so as to generate multiple upper areas that are surrounded by trenches. The un-etched zone is shaped in response to a shape of an object to be placed on the supporting element. The un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck.

Additionally or alternatively, stage 610 can include at least one of the following stages or a combination thereof: (i) chemically etching a chemically etched zone to provide multiple upper areas wherein an aggregate area of upper areas within the chemically etched zone is substantially smaller than an overall area of the chemically etched zone; (ii) manufacturing a supporting element so that the upper areas and an upper surface of the un-etched zone contact the object when the object is placed on the chuck in alignment with the un-etched zone; (iii) manufacturing the supporting element from a single material; (iv) manufacturing the supporting element from a conductive material; (v) manufacturing a supporting element that includes multiple un-etched zones; wherein each un-etched zone surrounds at least one chemically etched zone; (vi) manufacturing a supporting element that includes multiple concentric un-etched zones; (vii) manufacturing a supporting element that includes multiple quadratic shaped un-etched zones; (viii) manufacturing a supporting element that includes multiple un-etched zones wherein each un-etched zone is shaped in response to an object to be supported by the chuck; (ix) forming multiple pressurized gas conduits in the supporting element so as to enable pressurized gas provided to a lower surface of the supporting element to propagate through the trenches of each chemically etched zone; and the chuck is adapted to receive in an independent manner pressurized gas to each chemically etched zone; (x) chemically etching a chemically etched zone that includes multiple upper areas; wherein a distance between centers of two adjacent upper areas ranges between 200 micron and 300 micron and wherein a depth of the trenches ranges between 20 micron and 60 micron; (xi) chemically etching a chemically etched zone; wherein a distance between centers of two adjacent upper areas ranges between 200 micron and 300 micron and wherein a depth of the trenches ranges between 25 micron and 30 micron; (xii) forming multiple sensing aiding holes in the supporting element; wherein a sensing signal is sent through each sensing aiding hole in order to determine which object is placed on the supporting element; (xiv) generating multiple object supporting pins adapted to support the object during an object placement process and an object removal process; (xv) forming multiple cavities in a lower portion of the supporting element; wherein the cavities are closed by the closing element so as to form multiple pressurized gas chambers; (xvi) forming multiple cavities in correspondence to multiple chemically etched zones; (xvii) forming multiple cavities below each chemically etched zone.

Stage 610 and 620 involve commonly used manufacturing processes such as milling, turning, lapping and chemical etching.

Stage 610 and 620 conveniently involve using commonly used materials such as conductive materials and especially stainless steel.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A chuck comprising a supporting element that is connected to a closing element;
   wherein an upper surface of the supporting element comprises a chemically etched zone and an un-etched zone;
   wherein the chemically etched zone comprises multiple upper areas that are surrounded by trenches;
   wherein the un-etched zone is shaped in response to a shape of an object to be placed on the supporting element;
   wherein the un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck;
   wherein the chuck comprises multiple un-etched zones; wherein each un-etched zone surrounds at least one chemically etched zone;
   wherein multiple pressurized gas conduits are formed in the supporting element so as to enable pressurized gas provided to a lower surface of the supporting element to propagate through the trenches of each chemically etched zone; and
   wherein the chuck is adapted to be coupled to a pressurized gas delivery unit adapted to independently supply pressurized gas to each chemically etched zone.

2. The chuck according to claim 1 wherein an aggregate area of upper areas within the chemically etched zone is substantially smaller than an overall area of the chemically etched zone.

3. The chuck according to claim 1 wherein the upper areas and an upper surface of the un-etched zone contact the object when the object is placed on the chuck in alignment with the un-etched zone.

4. The chuck according to claim 1 wherein the supporting element is made of a single material.

5. The chuck according to claim 1 wherein the supporting element is made of a conductive material.

6. The chuck according to claim 1 wherein the multiple un-etched zones are concentric.

7. The chuck according to claim 1 wherein the multiple un-etched zones have a quadratic shape.

8. The chuck according to claim 1 wherein each un-etched zone is shaped in response to an object to be supported by the chuck.

9. The chuck according to claim 1 wherein the chuck comprises multiple object supporting pins adapted to support the object during an object placement process and an object removal process.

10. The chuck according to claim 1 wherein multiple cavities are formed in a lower portion of the supporting element; wherein the cavities are closed by the closing element so as to form multiple pressurized gas chambers.

11. The chuck according to claim 10 wherein the chuck comprises multiple chemically etched zones; and wherein the multiple cavities are formed in correspondence to the chemically etched zones.

12. The chuck according to claim 11 wherein multiple cavities are formed below each chemically etched zone.

13. The chuck according to claim 1 wherein the supporting element is made of stainless steel; wherein the supporting element is manufactured by multiple manufacturing processes selected from a list consisting of: chemical etching, milling, turning and lapping.

14. The chuck according to claim 1 wherein the pressurized gas is vacuumed gas.

15. The chuck according to claim 1 wherein the pressurized gas is a highly pressurized gas.

16. A chuck comprising a supporting element that is connected to a closing element;
   wherein an upper surface of the supporting element comprises a chemically etched zone and an un-etched zone;
   wherein the chemically etched zone comprises multiple upper areas that are surrounded by trenches;
   wherein at least one pressurized gas conduit is formed in the supporting element so as to enable pressurized gas provided to a lower surface of the supporting element to propagate through the trenches;
   wherein the un-etched zone is shaped in response to a shape of an object to be placed on the supporting element;
   wherein the un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck;
   wherein the chuck comprises multiple un-etched zones; wherein each un-etched zone surrounds at least one chemically etched zone;
   wherein a distance between centers of two adjacent upper areas ranges between 200 micron and 300 micron and wherein a depth of the trenches ranges between 20 micron and 60 micron.

17. The chuck according to claim 16 wherein an aggregate area of upper areas within the chemically etched zone is substantially smaller than an overall area of the chemically etched zone.

18. The chuck according to claim 16 wherein the upper areas and an upper surface of the un-etched zone contact the object when the object is placed on the chuck in alignment with the un-etched zone.

19. The chuck according to claim 16 wherein the supporting element is made of a single material.

20. The chuck according to claim 16 wherein the supporting element is made of a conductive material.

21. The chuck according to claim 16 wherein the multiple un-etched zones are concentric.

22. The chuck according to claim 16 wherein the multiple un-etched zones have a quadratic shape.

23. The chuck according to claim 16 wherein each un-etched zone is shaped in response to an object to be supported by the chuck.

24. The chuck according to claim 16 wherein the chuck comprises multiple object supporting pins adapted to support the object during an object placement process and an object removal process.

25. The chuck according to claim 16 wherein multiple cavities are formed in a lower portion of the supporting element; wherein the cavities are closed by the closing element so as to form multiple pressurized gas chambers.

26. The chuck according to claim 25 wherein the chuck comprises multiple chemically etched zones; and wherein the multiple cavities are formed in correspondence to the chemically etched zones.

27. The chuck according to claim 25 wherein the chuck comprises multiple chemically etched zones; and wherein the multiple cavities are formed in correspondence to the chemically etched zones.

28. The chuck according to claim 26 wherein multiple cavities are formed below each chemically etched zone.

29. The chuck according to claim 26 wherein multiple cavities are formed below each chemically etched zone.

30. The chuck according to claim 16 wherein the supporting element is made of stainless steel; wherein the supporting element is manufactured by multiple manufacturing processes selected from a list consisting of: chemical etching, milling, turning and lapping.

31. A chuck comprising a supporting element that is connected to a closing element;
   wherein an upper surface of the supporting element comprises a chemically etched zone and an un-etched zone;
   wherein the chemically etched zone comprises multiple upper areas that are surrounded by trenches;
   wherein at least one pressurized gas conduit is formed in the supporting element so as to enable pressurized gas provided to a lower surface of the supporting element to propagate through the trenches;
   wherein the un-etched zone is shaped in response to a shape of an object to be placed on the supporting element;
   wherein the un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck;
   wherein the chuck comprises multiple un-etched zones; wherein each un-etched zone surrounds at least one chemically etched zone;
   wherein a distance between centers of two adjacent upper areas ranges between 200 micron and 300 micron and wherein a depth of the trenches ranges between 25 micron and 30 micron.

32. The chuck according to claim 31 wherein an aggregate area of upper areas within the chemically etched zone is substantially smaller than an overall area of the chemically etched zone.

33. The chuck according to claim 31 wherein the upper areas and an upper surface of the un-etched zone contact the object when the object is placed on the chuck in alignment with the un-etched zone.

34. The chuck according to claim 31 wherein the supporting element is made of a single material.

35. The chuck according to claim 31 wherein the supporting element is made of a conductive material.

36. The chuck according to claim 31 wherein the multiple un-etched zones are concentric.

37. The chuck according to claim 31 wherein the multiple un-etched zones have a quadratic shape.

38. The chuck according to claim 31 wherein each un-etched zone is shaped in response to an object to be supported by the chuck.

39. The chuck according to claim 31 wherein the chuck comprises multiple object supporting pins adapted to support the object during an object placement process and an object removal process.

40. The chuck according to claim 31 wherein multiple cavities are formed in a lower portion of the supporting element; wherein the cavities are closed by the closing element so as to form multiple pressurized gas chambers.

41. The chuck according to claim 31 wherein the supporting element is made of stainless steel; wherein the supporting element is manufactured by multiple manufacturing processes selected from a list consisting of: chemical etching, milling, turning and lapping.

42. A chuck comprising a supporting element that is connected to a closing element;
   wherein an upper surface of the supporting element comprises a chemically etched zone and an un-etched zone;
   wherein the chemically etched zone comprises multiple upper areas that are surrounded by trenches;
   wherein at least one pressurized gas conduit is formed in the supporting element so as to enable pressurized gas provided to a lower surface of the supporting element to propagate through the trenches;
   wherein the un-etched zone is shaped in response to a shape of an object to be placed on the supporting element;
   wherein the un-etched zone reduces pressurized gas leakage from the un-etched zone and the closing element reduces pressurized gas leakage from a lower surface of the supporting element when the object is placed on the chuck in alignment with the un-etched zone and pressurized gas is provided to the chuck;
   wherein the chuck comprises multiple un-etched zones; wherein each un-etched zone surrounds at least one chemically etched zone;
   wherein multiple sensing aiding holes are formed in the supporting element; wherein a sensing signal is sent through each sensing aiding hole in order to determine which object is placed on the supporting element.

43. The chuck according to claim 42 wherein an aggregate area of upper areas within the chemically etched zone is substantially smaller than an overall area of the chemically etched zone.

44. The chuck according to claim 42 wherein the upper areas and an upper surface of the un-etched zone contact the object when the object is placed on the chuck in alignment with the un-etched zone.

45. The chuck according to claim 42 wherein the supporting element is made of a single material.

46. The chuck according to claim 42 wherein the supporting element is made of a conductive material.

47. The chuck according to claim 42 wherein the multiple un-etched zones are concentric.

48. The chuck according to claim 42 wherein the multiple un-etched zones have a quadratic shape.

49. The chuck according to claim 42 wherein each un-etched zone is shaped in response to an object to be supported by the chuck.

50. The chuck according to claim 42 wherein the chuck comprises multiple object supporting pins adapted to support the object during an object placement process and an object removal process.

51. The chuck according to claim 42 wherein multiple cavities are formed in a lower portion of the supporting element; wherein the cavities are closed by the closing element so as to form multiple pressurized gas chambers.

52. The chuck according to claim 51 wherein the chuck comprises multiple chemically etched zones; and wherein the multiple cavities are formed in correspondence to the chemically etched zones.

53. The chuck according to claim 52 wherein multiple cavities are formed below each chemically etched zone.

54. The chuck according to claim 42 wherein the supporting element is made of stainless steel; wherein the supporting element is manufactured by multiple manufacturing processes selected from a list consisting of: chemical etching, milling, turning and lapping.

* * * * *